United States Patent [19]
Kojima et al.

[11] Patent Number: 5,298,296
[45] Date of Patent: Mar. 29, 1994

[54] PROCESS FOR THE ELABORATION OF POWDERS UNIFORMLY COATED WITH ULTRAFINE SILICON-BASE PARTICLES USING CHEMICAL VAPOR DECOMPOSITION IN THE PRESENCE OF CORE POWDERS

[75] Inventors: Toshinori Kojima, Musashino; Masahiko Matsukata, Tokyo; Eiichi Ozawa, Katsushika; Jean-Marie Friedt, Funakawara, all of Japan

[73] Assignee: L'Air Liquide, Societe Anonyme pour l'Etude et l'Exploitation des Procedes Georges Claude, Paris Cedex, France

[21] Appl. No.: 7,362

[22] Filed: Jan. 21, 1993

Related U.S. Application Data

[63] Continuation of Ser. No. 724,917, Jul. 2, 1991, abandoned.

[51] Int. Cl.$^5$ .............................................. C23C 16/44
[52] U.S. Cl. .................................... 427/600; 427/185; 427/213; 427/215; 427/216; 427/255; 427/255.1; 427/255.2; 427/255.3; 118/716; 423/344; 423/349
[58] Field of Search ............... 427/185, 213, 215, 216, 427/255, 255.1, 255.2, 255.3, 600; 423/349, 350, 344; 118/716

[56] References Cited

U.S. PATENT DOCUMENTS

| | | | |
|---|---|---|---|
| 3,012,862 | 12/1961 | Bertrand et al. | 427/213 |
| 3,963,838 | 6/1976 | Setty et al. | 423/350 |
| 4,084,024 | 4/1978 | Schumacher | 427/215 |
| 4,154,870 | 5/1979 | Wakefield | 423/350 |
| 4,207,360 | 6/1980 | Padovani | 423/349 |
| 4,292,344 | 9/1981 | McHale | 118/716 |
| 4,314,525 | 2/1982 | Hsu et al. | 423/349 |
| 4,416,913 | 11/1983 | Ingle et al. | 427/215 |
| 4,552,593 | 11/1985 | Ostertag | 106/417 |
| 4,748,052 | 5/1988 | Allen | 423/350 |
| 4,774,102 | 9/1988 | Kiefer et al. | 427/28 |
| 4,784,840 | 11/1988 | Gautreaux et al. | 423/349 |
| 4,786,477 | 11/1988 | Yoon et al. | 118/716 |
| 4,789,510 | 12/1988 | Toda | 501/109 |
| 4,820,587 | 4/1989 | Gautreaux et al. | 428/403 |
| 4,851,297 | 7/1989 | Allen et al. | 427/213 |
| 4,859,443 | 8/1989 | Marosi | 427/213 |
| 4,868,013 | 9/1989 | Allen | 423/349 |
| 4,883,687 | 11/1989 | Gautreaux et al. | 427/213 |
| 4,904,452 | 2/1990 | Acharya et al. | 422/146 |
| 5,041,308 | 8/1991 | Kuramoto | 427/255.1 |
| 5,077,028 | 12/1991 | Age | 423/350 |
| 5,149,514 | 9/1992 | Sonjurjo | 427/255.2 |

FOREIGN PATENT DOCUMENTS

| | | | |
|---|---|---|---|
| 0167703 | 1/1986 | European Pat. Off. | 427/255.2 |
| 61-242904 | 10/1986 | Japan . | |

OTHER PUBLICATIONS

English Language Abstract of DE 3,910,343 a (Oct. 1989) and JP 02-021938 (Jan. 1990).

*Primary Examiner*—Terry J. Owens
*Attorney, Agent, or Firm*—Oblon, Spivak, McClelland, Maier & Neustadt

[57] ABSTRACT

A process for coating powders with ultrafine particles of silicon, silicon oxide, silicon nitride or alloys thereof, entailing:
  a) introducing a reactant gas into a bed of core powders, thereby uniformly suspending the core powders in the reactant gas,
  b) entraining the uniformly suspended core powders into a chemical vapor deposition (CVD) reactor,
  c) selectively forming ultrafine particles of silicon, silicon oxide, silicon nitride or alloys thereof in the gas phase by homogeneous deposition of the reactant gas, while minimizing core powder growth by CVD at surfaces of suspended core powders, and
  d) coating the core powders with the ultrafine particles of silicon, silicon oxide, silicon nitride or alloys thereof, by introducing hot inert gas into the uniformly suspended core powders in the reactant gas.

11 Claims, 2 Drawing Sheets

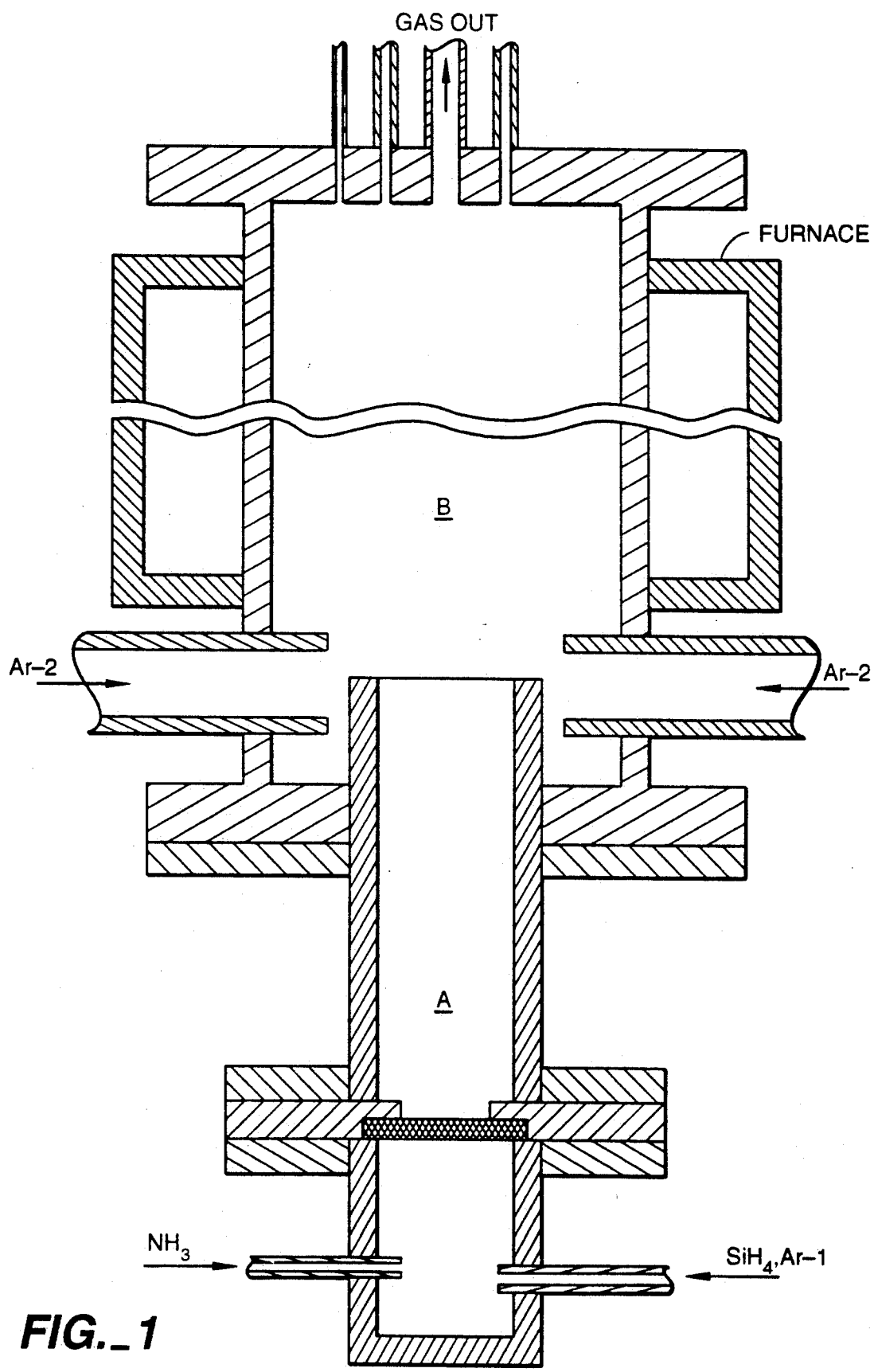
FIG._1

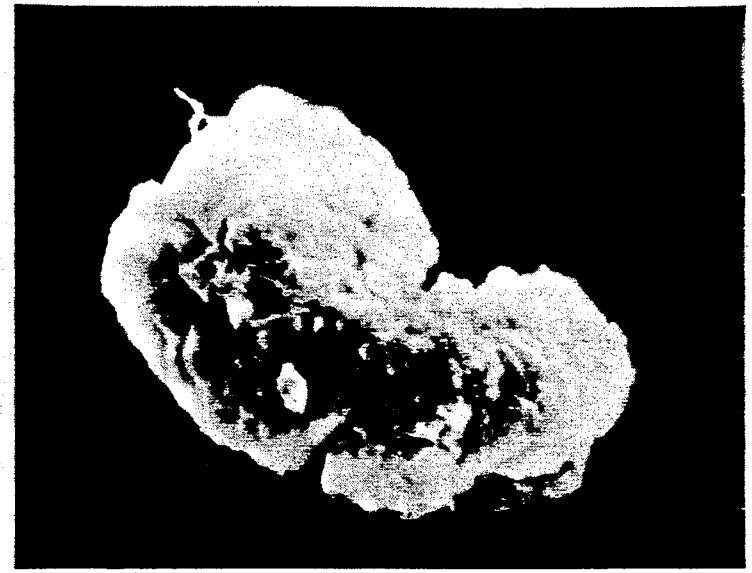
SEED POWDER
⊢———⊣
2.5μ
FIG._2A
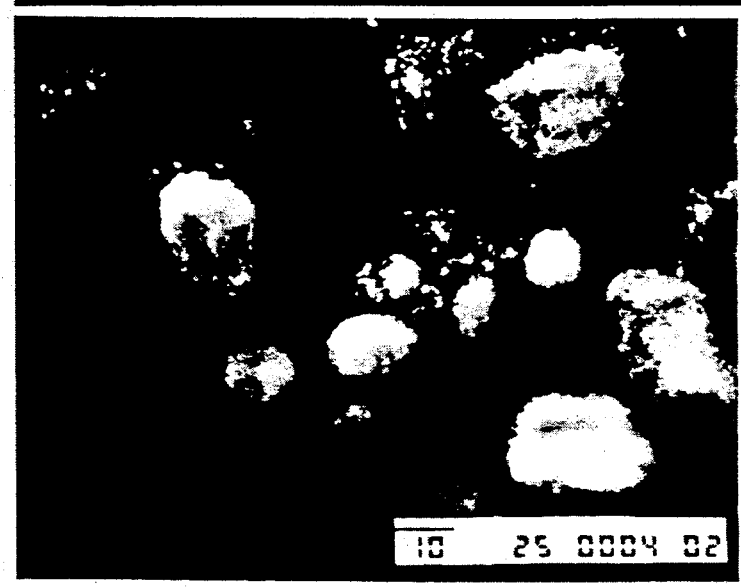
COATED POWDER
⊢———⊣
10μ
FIG._2B
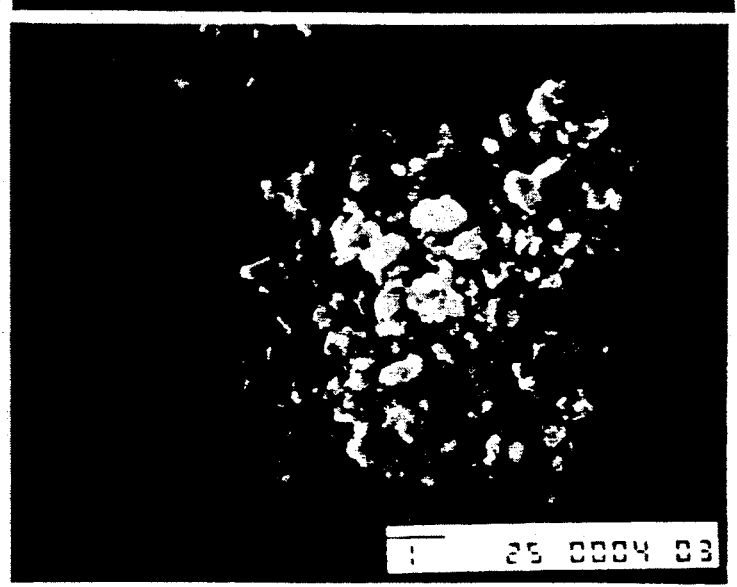
COATING PARTICLES
⊢———⊣
1.0μ
FIG._2C

PROCESS FOR THE ELABORATION OF POWDERS UNIFORMLY COATED WITH ULTRAFINE SILICON-BASE PARTICLES USING CHEMICAL VAPOR DECOMPOSITION IN THE PRESENCE OF CORE POWDERS

This application is a continuation of application Ser. No. 07/724,917, filed on Jul. 2, 1991, now abandoned.

BACKGROUND OF THE INVENTION

1. Field of the Invention

The present invention relates to a process for elaboration of powders uniformly coated with ultrafine silicon-base particles.

2. Description of the Background

Elaboration of ultrafine particles of silicon, silicon oxide or silicon nitride or their alloys by gas phase chemical vapor deposition (CVD) using various means of energy supply, such as thermal, plasma or optical, is well documented. The particles produced thereby are significantly finer than those formed from other processes, i.e., having a typical average diameter of 0.01 μm to 1 μm as compared to 0.5 to 5 μm, respectively. See P. Ho et al, *J. Mater. Research*, 4, 873 (1989) and L. M. Sheppard, *Adv. Mater. Processes*, 4, 53 (1987).

Such a gas phase process is advantageous because high purity and control stoichiometry is achieved. Generally, product purities can be obtained which correspond to the purities of the gas phase precursor, i.e., $SiH_4$, $SiH_2Cl_2$ and $SiCl_4$, for example.

However, despite the advantages obtained using gas phase CVD to form particles of silicon, silicon oxide or silicon nitride, it remains very difficult to produce monosized particles thereby. Moreover, in using this method, it is difficult to avoid agglomeration of such ultrafine powders. Unfortunately, such drawbacks render difficult the application of the gas phase process to the synthesis of monodisperse and non-agglomerated powders.

Heterogeneous CVD growth of suspended particles is also rather well known, for example, EP 258027 discloses a process for producing polysilicon which entails contacting silicon particles in a fluidized bed with a silicon precursor gas at a decomposition temperature resulting in the deposition of silicon on the particles by CVD and deposition of silicon dust on the particle surfaces, and modifying the conditions so that a thin layer of silicon is deposited on the particle surfaces to bind the silicon dust.

Also, it is known that powders can be suspended in a fluidized bed. Further, suspension and growth of seed powders by gas phase CVD in a fluidized bed reactor is known for fabrication of ultra-pure silicon from silane ($SiH_4$, $Si_2H_6$), for example, for further processing into a silicon wafer.

For example, DE 3,910,328-A describes a fluidized bed reactor having heatable inside and outside walls, wherein the space between these walls is the reaction zone for the fluidized bed. The walls of the reactor are concentric cylinders with the diameter of the inner cylinder preferably being 10-95% of the diameter of the outer cylinder. Further, the walls are heated by induction or resistance heating or by conduction and the heatable area of the inner wall is 10-95% of the heatable area of the outer wall.

As another example, DE 3,910,343-A discloses a fluidized bed reactor consisting of a reaction vessel with an inner zone for the fluidized bed and a peripheral annular heating zone there around. The heating zone has a passage for transferring particles from the reaction zone to the heating zone at the top and a passage for transferring particles from the heating zone to the reaction zone at the bottom.

SUMMARY OF THE INVENTION

Accordingly, it is an object of the present invention to provide a process for producing powders coated by ultrafine particles of silicon, silicon oxide, silicon nitride or alloys thereof with a size distribution corresponding to the one of the core powders used in the process.

The above objects and others which will become more apparent in view of the following disclosure are provided by a process for coating ceramic or other powders with ultrafine particles of silicon, silicon oxide, silicon nitride or alloys thereof, which entails:

a) uniformly suspending core powders in a reactant gas into a CVD reactor from a bed of core powders, b) selectively forming ultrafine particles of silicon, silicon oxide, silicon nitride or alloys thereof in the gas phase, by homogeneous decomposition of a reactive feed gas mixture, while avoiding core powder growth by CVD at surfaces of suspended core powders, and c) coating the core powders with the ultrafine particles of silicon, silicon oxide, silicon nitride or alloys thereof.

BRIEF DESCRIPTION OF THE DRAWINGS

FIG. 1 illustrates a reactor used to practice the method of the present invention.

FIGS. 2a, 2b and 2c illustrate scanning electromicroscope images of various powders as described below:

a) uncoated powders of silicon nitride, b) ultrafine coated silicon nitride powders, and c) high resolution image of the coated powder surface.

DETAILED DESCRIPTION OF THE PREFERRED EMBODIMENTS

In accordance with the present invention, a process is provided for coating ceramic or other powders with ultrafine particles of silicon, silicon oxide, silicon nitride or alloys thereof.

In general, the ceramic or other powders are suspended in a gas-solid reactor, such as a fluidized bed reactor, and the ultrafine particles are generated by CVD from pure silane ($SiH_4$) or silane mixed with oxygen and nitrogen donor molecules.

In accordance with the present invention, the uniform suspension of core powders in the reactant gas may be effected in any type of bed. For example, an entrainment bed, fluidized bed or a fast fluidized bed may be used.

The powders produced in accordance with the present invention are advantageous for a number of practical applications in view of their sintering properties, and/or their disagglomeration properties, and/or their anti-corrosion and anti-oxidation properties and/or their use in composite manufacturing.

In more detail, the present process entails first uniformly suspending core powders in a reactant gas through, for example, entrainment of core powders into the CVD reactor from a fluidized bed of core powders.

In accordance with the present invention, it is important that the suspended core powders be suspended in reactant gas. Mixing of the reactant gas with core particles is important in order to ensure that homogenous reaction proceeds near the core particles. However, the suspension of the core powders mixed with reactive gas is kept cold before mixing with hot inert gas, where homogenous decomposition proceeds.

Further, the heating of the reactant gas in the presence of the core powder is effected, primarily, by introducing heated inert gas through electrically heated tubing. That is, the heating is provided primarily by the inert gas. However, radiation convection heating also occurs from the reactor walls.

The conversion efficiency of the homogeneous gas phase decomposition may be effected by controlling the flow rates, temperature, reactor geometry and by using residence times of the core powders and the reactant gas in the reactor which are approximately equal.

The core powders are of an arbitrary composition, preferably ceramic and metal powders, and are generally of approximately equiaxial size in the range of from 0.1 $\mu$m to 1 mm.

Then, ultrafine particles of silicon, silicon oxide, silicon nitride or alloys thereof are formed by homogeneous reaction in the gas phase while avoiding core powder growth by CVD. This is achieved preferably through 1) introducing hot inert gas into a cooled suspension of core powders in the reactant gas, 2) hence, heating of the reactant gas preferentially in the presence of the core powders, and 3) simultaneously controlling the residence time of the core powders in the reactor.

The two reactant gases can be introduced together at the bottom of the powder feeder or, else, one of the reactant gases, e.g. oxygen or ammonia, may be introduced together with the inert heating gas, separately from the other reactant gas, such as silicon hydride, silicon chloride or other silicon carrier gas.

Then, the ultrafine particle powders composed of silicon, silicon oxide or silicon nitride or an alloy thereof are formed by CVD reaction from silane and inert or reactant gases, such as $N_2$, Ar, $O_2$, $N_2O$, $NH_3$, $N_2H_4$ or their mixtures, for example.

The chemical composition, crystal structure (including amorphous), morphology and thickness of the coating is controlled by adjustment of the CVD reactor parameters. The coating is of ultra-high purity, corresponding to the gas precursor purity.

In accordance with the present invention, the reactant gas contains one or more silicon carrier compounds, such as $SiH_4$, $Si_2H_6$, $Si_3H_9$, $SiCl_{4-x}H_x$, wherein x is 0 to 3 or $SiF_{4-x}H_x$, wherein x is 0 to 3. However, the reactant gas may also contain one or more other reactant compounds, such as $N_2$, $NH_3$, $N_2H_4$, $O_2$, $N_2O$, NO, $NO_2$, CO or $CO_2$ or a mixture thereof.

Generally, the coating of the core powders by the ultrafine particles is effected by introducing hot inert gas into a cooled suspension of core powders in the reactive feed gas mixture. However, one of the reactant gases of the feed mixture may be introduced together with the hot inert gas.

In accordance with the present invention, the suspension of the core powders occurs at the bottom of the bed of the CVD reactor. Further, the suspension of the core powders may be assisted by mechanical or ultrasonic vibration.

Generally, the homogeneous ultrafine particles are formed by homogeneous gas phase decomposition of the reactive feed gas at a temperature of about 200–1,200° C. However, it is preferred if the decomposition is effected at a temperature of about 500–800° C.

Thus, the present invention provides powders which are uniformly coated by CVD synthesis of ultrafine powders in a suspension type reactor, such as an entrainment bed, fast fluidized bed and fluidized bed.

The resulting coated powders are of interest for their sintering properties for manufacture of ceramic bodies or metal-ceramic matrix composites.

The resulting powders may advantageously be used in the manufacture of high quality ceramic bodies or composite bodies when using ceramic or other powders, respectively, in the gas phase suspension type reactor for improved sintering behavior. The improved sintering behavior entails low temperature sintering or enhanced final density, for example.

There are numerous application to which the present invention may be put. A few may be mentioned hereinbelow.

First, ceramic powders may be coated with a silicon coating for use in subsequent reactive sintering.

Second, ceramic powders may be coated with a silicon nitride coating to afford lower sintering temperatures and improved properties in the final product.

Third, any powder may be coated with a silicon oxide coating to afford improved properties for dispersion, agglomeration control, grinding or air corrosion behavior.

Fourth, any powder may be coated with silicon, silicon nitride, silicon oxide, and mixed oxides and nitrides ($SiN_xO_4$) for use in composite manufacturing.

EXAMPLE

In order to further describe the present invention, reference will now be made to FIG. 1 as an illustrative example of a process description. However, this example is only illustrative and is not intended to be limitative.

In FIG. 1, core powders are suspended through the introduction of gas flow at the bottom of the bed, assisted, if desired, by mechanical or ultrasonic vibration or turbulent gas flow agitation or entrainment by other means.

Then, in Part <B> of the reactor selective homogeneous nucleation by gas phase decomposition of reactive feed gas is effected. Generally, the reactive feed gas mixture, such as silane or silane-based mixtures are heated at a sufficient temperature for forming ultrafine particles under conditions so as to prevent core powder growth by CVD at the surface of the core powders. Typically, the reactive feed gas mixture is heated at from about 200–1,200° C., and more preferably at from about 500–800° C. when silane ($SiH_4$) is used as a reactant gas.

Thereafter, the core powders and ultrafine particles interact to provide a coating by the ultrafine particles on the suspended core powders.

The coating composition, morphology, thickness, uniformity is controllable by adjusting the temperature profile, gas flows, relative powder concentrations and fluid dynamics and turbulences.

The coated powders are collected at the exit of the CVD reactor, for example, on a filtering system under controllable atmosphere and ar handled subsequently in inert conditions.

In more detail, FIG. 1 shows the scheme of a reactor. <A> represents a space for setting and fluidizing seed powders. <B> represents a reaction zone where the core powder is suspended to be coated by ultrafine particles. The furnace is set surrounding space <B> to heat up the gases for the generation of ultrafine particles. At the bottom of space <B> there are other gas supplying pipe lines (Ar-2) with the temperature of supplied gases being controlled.

Reaction gases, such as silane and ammonia, and Ar-1 are introduced from the bottom of the fluidized bed. Then the powder is transported from the space <A> to space <B> in the suspended condition. Ultrafine particles are generated thermally from gases in space B. Then ultrafine particles coat the core powders in space <B>.

Table 1 shows typical experimental conditions for ultrafine particle deposition and coating on core powder. In experiment No. 1 the reaction temperature (Temp. of space <B>) is 600° C. and the temp. of Ar-2 is Room Temp. In experiment No. 3 Ar-2 temp. is 255° C. and the other conditions are the same an No. 1. No. 4 experiment has been made at 500° C., No. 5 experiment does not use Ar-2 supply. In No. 6–No. 8 experiments, Ar-2 was supplied through ¼ inch pipe inserted from top flange down to bottom of part B. The difference between No. 1 and No. 3 is silane conversion rate. No. 3 has higher conversion rate because of high Ar-2 temperature. No.4 has lower conversion rate than No. 1 due to lower reaction temperature. No. 5 (no Ar-2, one-third of total Ar flow of No. 1) has 100% silane conversion rate. All samples show ultrafine particle coating surface of core powder.

However, No. 5 sample presents coarse particles (0.3 μm) grown on the surface.

Table provides the results obtained using the experimental conditions of Table 1.

TABLE 1

Examples for deposition conditions

| RUN | Temp. (°C.) Reactor | Temp. (°C.) Ar-2 | Flow Rate (l min$^{-1}$) Ar-1 | Flow Rate (l min$^{-1}$) Ar-2 | Flow Rate (l min$^{-1}$) SIH$_4$ | Flow Rate (l min$^{-1}$) NH$_3$ |
|---|---|---|---|---|---|---|
| NO. 1 | 600 | Room Temp. | 5.0 | 10 | 2.5 × 10$^{-2}$ (0.167%) | 0 |
| NO. 2 | 600 | Room Temp. | 10 | 10 | 9.5 × 10$^{-3}$ (0.0472%) | 0 |
| NO. 3 | 600 | 255 | 5.0 | 10 | 2.5 × 10$^{-2}$ (0.167%) | 0 |
| NO. 4 | 500 | 205 | 5.0 | 10 | 2.5 × 10$^{-2}$ (0.167%) | 0 |
| NO. 5 | 600 | — | 5.0 | 0 | 2.5 × 10$^{-2}$ (0.498%) | 0 |
| NO. 6 | 600 | 600* | 5.0 | 10 | 2.5 × 10$^{-2}$ (0.167%) | 0 |
| NO. 7 | 600 | 600* | 5.0 | 10 | 2.5 × 10$^{-2}$ (0.167%) | 5.0 × 10$^{-2}$ (0.332%) |
| NO. 8 | 600 | 600* | 5.0 | 10 | 2.5 × 10$^{-2}$ (0.164%) | 3.0 × 10$^{-1}$ (1.973%) |

The figure in parentheses represents concentration.
*Supplied through ¼ in. pipe inserted from top flange down to bottom of part(B)

TABLE 2

Results obtained from the conditions of Table 1.

| RUN | Reaction Time (min) | The amount of bed material decreased (g) | The amount of Si deposited (g) | The amount of N deposited (g) | The amount of particles collected (g) | SiH$_4$ conversion (%) | NH$_3$ conversion (%) |
|---|---|---|---|---|---|---|---|
| NO. 1 | 42 | 4.42 | 1.07 | — | 1.11 | 69.54 | — |
| NO. 2 | 38 | 4.38 | 0.873 | — | 2.38 | 78.20 | — |
| NO. 3 | 20 | 1.20 | 0.538 | — | 0.90 | 86.59 | — |
| NO. 3 | | (0.871) | | | | | |
| NO. 4 | 30 | 1.80 | 0.119 | — | 0.98 | 14.88 | — |
| NO. 4 | | (1.31) | | | | | |
| NO. 5 | 35 | 0.700 | 1.40 | — | 0.74 | 100.00 | — |
| NO. 5 | | (1.52) | | | | | |
| NO. 6 | 30 | 1.22 | 0.968 | — | 0.21 | 69.28 | — |
| NO. 7 | 40 | 1.64 | 0.478 | 0.172 | 0.63 | 41.41 | 15.00 |
| NO. 8 | 50 | 2.05 | 0.518 | 0.313 | 0.57 | 35.95 | 3.63 |

The reactor used in accordance with the present invention may be a commercially available reactor, such as an entrainment type reactor. The reactor is preferably made of stainless steel. Further, it is also advantageous to use silicon- or quartz-coated walls for more stringent purity requirements.

Having described the present invention, it will be apparent to one skilled in the art that many changes and modifications can be made without departing from the spirit and the scope of the present invention.

What is claimed as new and desired to be secured by letters patent of the United States is:

1. A process for coating powders with ultrafine particles of silicon, silicon oxide, silicon nitride or alloys thereof, which comprises:

a) introducing into a chemical vapor deposition (CVD) reactor a reactant gas consisting of one or more silicon carrier compounds selected from the group consisting of SiH$_4$, Si$_2$H$_6$, Si$_3$H$_9$, SiClF$_{4-x}$H$_x$, wherein x is 0 to 3; and SiF$_{4-x}$H$_x$, wherein x is 0 to 3; or a reactant gas consisting of one or more of the silicon carrier compounds in combination with another reactant gas selected from the group consisting of N$_2$, NH$_3$, N$_2$H$_4$, O$_2$, N$_2$O, NO, NO$_2$, CO, CO$_2$ and a mixture thereof;

b) entraining core powders into the CVD reactor so as to uniformly suspend the core powders in the reactant gas; and c) introducing an inert gas into the uniformly suspended core powders in the reactant gas, which inert gas is at a higher temperature than said reactant gas containing the uniformly suspended core powders and at a temperature of from about 200° C. to about 1,200° C., which temperature is sufficient to effect homogeneous decomposition of the reactant gas, thereby selectively forming in the CVD reactor ultrafine particles of silicon, silicon oxide, silicon nitride or alloys thereof, while inhibiting growth of core powders by CVD at surfaces of the suspended core powders, thereby coating the core powders with the ultrafine particles formed.

2. The process of claim 1, wherein one reactant gas is introduced together with the inert gas.

3. The process of claim 1, wherein said suspension of the core powders occurs at the bottom of the bed of said CVD reactor.

4. The process of claim 1, which further comprises assisting the suspension of said core powders by mechanical or ultrasonic vibration.

5. The process of claim 1, wherein said gas phase decomposition of said reactant gas is effected at a temperature of about 500–800° C.

6. The process of claim 1, which further comprises cooling the suspended core powders prior to introducing the hot inert gas into the uniformly suspended core powders in the reactant gas.

7. The process of claim 1, wherein said hot inert gas is introduced by electrically heated tubing.

8. The process of claim 1, wherein said core powders are in the range of from 0.1 $\mu$m to 1 mm in size.

9. The process of claim 8, wherein said core powders are selected from the group consisting of ceramic and metal particles.

10. The process of claim 1, wherein the core powders are entrained into the CVD reactor in step b) from a bed of core powders.

11. The process of claim 10, wherein said bed is selected from the group consisting of an entrainment bed, a fluidized bed and a fast fluidized bed.

* * * * *